United States Patent

Bazydola et al.

[11] Patent Number: 5,970,621
[45] Date of Patent: Oct. 26, 1999

[54] SEMICONDUCTOR WAFER CASSETTE POSITIONING AND DETECTION MECHANISM

[75] Inventors: Kenneth J. Bazydola, Waltham; Robert L. Price, West Boylston, both of Mass.

[73] Assignee: PRI Automation, Inc., Billerica, Mass.

[21] Appl. No.: 09/227,177

[22] Filed: Jan. 7, 1999

Related U.S. Application Data

[60] Provisional application No. 60/071,299, Jan. 16, 1998.

[51] Int. Cl.⁶ .................................................. B65G 49/07
[52] U.S. Cl. .............................. 33/613; 33/533; 33/645; 414/935; 414/936; 414/940
[58] Field of Search .............................. 33/613, 533, 623, 33/645; 414/935–941

[56] References Cited

U.S. PATENT DOCUMENTS

| | | | |
|---|---|---|---|
| 4,805,316 | 2/1989 | Curti | 33/613 |
| 5,138,772 | 8/1992 | Barnes | 33/613 |
| 5,610,102 | 3/1997 | Gardopee et al. | 414/936 |
| 5,645,391 | 7/1997 | Ohsawa et al. | 414/936 |
| 5,733,024 | 3/1998 | Slocum et al. | 414/935 |

*Primary Examiner*—Christopher W. Fulton
*Attorney, Agent, or Firm*—Weingarten, Schurgin, Gagnebin & Hayes LLP

[57] ABSTRACT

An apparatus for detecting the presence of a wafer cassette, or pod, resting on an arrangement of pins allows cassette detection without interfering with insertion of a robotic paddle arm beneath the cassette to remove it for transport. A cassette resides on an arrangement of beveled pins which mate with corresponding receptacles on the underside. Pins supporting the cassette have a spring biased, hollow outer cylinder coaxially mounted around a center post. A cassette placed on the pins displaces the outer cylinder downward a sufficient distance to trigger a sensor. Upon removal of the cassette, the outer cylinder is displaced upwards, resetting the sensor.

10 Claims, 8 Drawing Sheets

SEMICONDUCTOR WAFER CASSETTE POSITIONING AND DETECTION MECHANISM

CROSS REFERENCE TO RELATED APPLICATIONS

This application claims priority to U.S. provisional patent application Ser. No. 60/071,299, filed Jan. 16, 1998, entitled Kinematic Coupling Nest Switch, the disclosure of which is incorporated herein by reference.

STATEMENT REGARDING FEDERALLY SPONSORED RESEARCH OR DEVELOPMENT

None.

BACKGROUND OF THE INVENTION

In a semiconductor wafer processing environment, semiconductor wafers must be protected from contaminants and physical agitation. Such wafers are used to manufacture electronic components such as computer memory and microprocessors, and require certain physical characteristics so that electronic circuit elements may be fabricated onto the wafer surface. Manufacturing imperfections, such as those which can arise from dust, dirt, bumping, and jarring, can render a wafer unusable.

Accordingly, such wafers are often stored and transported in a sealable container called a wafer pod, or cassette. Such cassettes have a series of interior ridges on opposing sides to support a batch of wafers horizontally, and a removable door to allow access to the contents. Typically an automated, apparatus, such as a robotic arm or conveyor system, is used to transport these cassettes to minimize human manipulation which can lead to dropping and bumping of a loaded cassette, and further to damage and loss of wafer stock. Such an apparatus transports cassettes between different processing stations during various phases of the wafer manufacturing and treatment process.

Figure 1A:
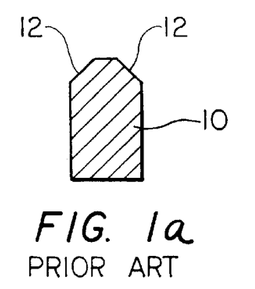
FIG. 1a shows the prior art pin assembly shape.
Figure 1B:
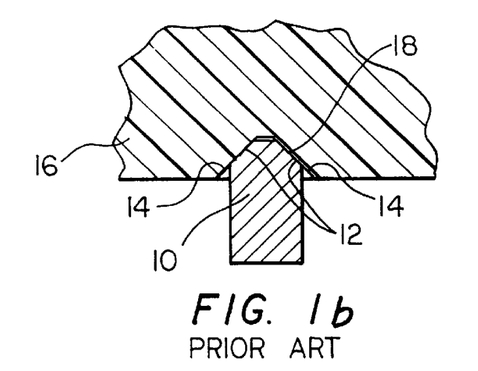
FIG. 1b shows a cassette nested on a prior art pin assembly.

At each processing station, the cassette is placed on a support platform which includes an arrangement of pins having beveled tops called a nest, which mate with corresponding beveled receptacles on the bottom of the cassette. The beveled tops allow precise, consistent placement while affording some tolerance of movement when placing the cassette on the pins. A typical prior art pin assembly is shown in FIGS. 1a, 1b. Typically three pin assemblies are used to support a cassette, of which a single traditional pin assembly 10 is shown in FIG. 1a. The beveled edges 12 mate with a corresponding beveled surface 14 on a cassette 16 at a contact area 18, as shown in FIG. 1b.

Removal of the cassette from the nested position on the pin assemblies can involve insertion of a robotic arm, or paddle, under the cassette between the pin assemblies, and lifting upwards. Traditional pin arrangements, however, incorporate cassette sensing pads which reside under the cassette in the area between the pins to sense the presence of a cassette by being displaced downward. Such pads, therefore, interfere with insertion of the paddle underneath the cassette.

Figure 2A:
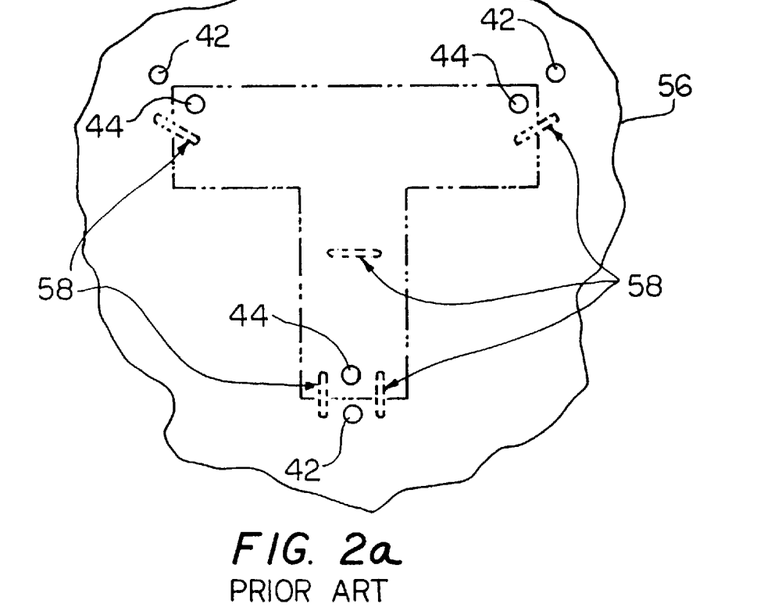
FIG. 2a shows a schematic illustration of prior art receptacle and sensor arrangements.
Figure 2B:
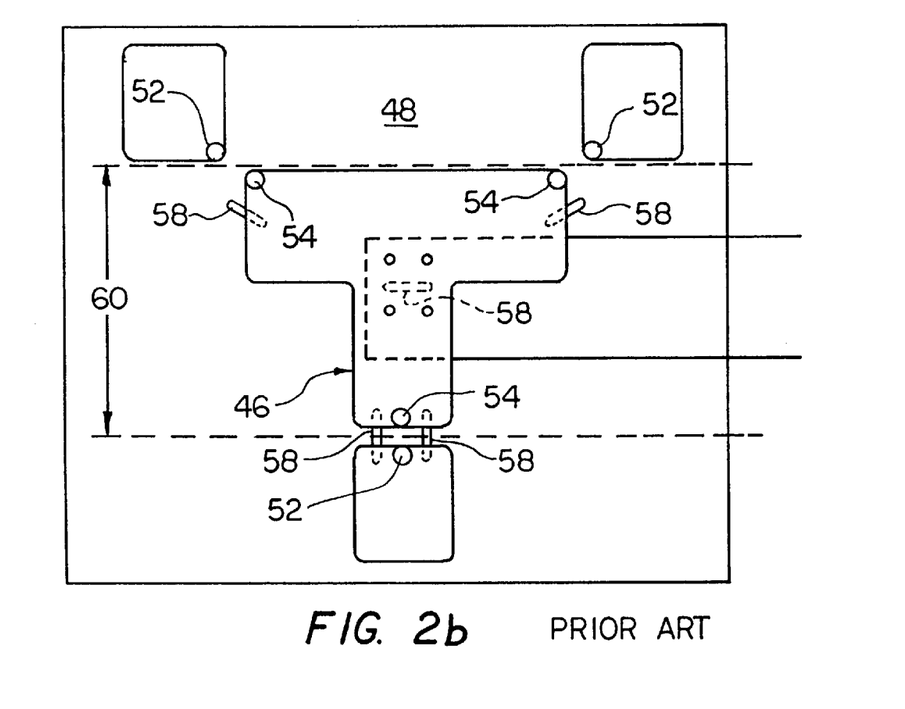
FIG. 2b shows a typical prior art pin assembly arrangement for a processing station and paddle.

A typical cassette receptacle and pin assembly arrangement is shown in FIGS. 2a, 2b, respectively. Two triangular orientations are commonly used. On the bottom side of a cassette 56, a larger, outer pin assembly receptacle orientation 42 is used to support a cassette nested at a processing station, while an inner pin assembly receptacle orientation 44 is used by a robotic paddle arm to transport cassettes between processing stations. The corresponding pin assembly orientations on the processing station 48 are shown in FIG. 2b. The inner set of pins 54 is mounted on a paddle 46, while the outer set 52 corresponds to placement at the processing station 48. Referring to FIGS. 2a, 2b, paddle 46 can effect removal of cassette 56 by being inserted between the outer set of pins 52 beneath the cassette 56, and lifting upward such that inner pins 54 engage inner receptacles 44.

Prior art cassette detection methods using cassette sensing pads 58 are incompatible with the use of the paddle 46 in FIG. 2b. As such pads reside within the paddle exclusion zone 60, they can interfere with the insertion of the paddle 46 between the outer set of pins 52 beneath the cassette 56. Alternative sensor placement is undesirable due to the need to maintain compliance with industry standards, and alternate non-interfering insertion paths of the paddle can complicate design of new systems and may not be suitable for existing paddle systems.

BRIEF SUMMARY OF THE INVENTION

A cassette sensing mechanism for detecting the presence of a wafer pod, or cassette, nested on a pin assembly arrangement allows cassette detection without interfering with insertion of a robotic paddle arm beneath the cassette to remove it for transport. Cassettes so nested reside on an arrangement of beveled pins which mate with corresponding beveled receptacles on the underside of the cassette. One or more pin assemblies supporting the cassette has a spring biased, hollow outer cylinder which slides up and down around a center post. When a cassette is placed on the pin assemblies, the outer cylinder of each pin assembly is displaced downwards against the spring bias a sufficient distance to trigger a sensor, thereby indicating the presence of a cassette. Upon removal of the cassette, the outer cylinder is displaced upwards by the spring, thereby resetting the sensor to indicate no cassette is present.

BRIEF DESCRIPTION OF THE SEVERAL VIEWS OF THE DRAWING

FIG. 7b is a top or plan view of the pin assembly in 7a;

FIG. 8b shows a top or plan view of the pin assembly in 8a;

FIG. 9b shows a top or plan view of the pin assembly in 9a;

FIG. 10b shows a top view of the pin assembly in FIG. 10a.

DETAILED DESCRIPTION OF THE INVENTION

Figure 3A:
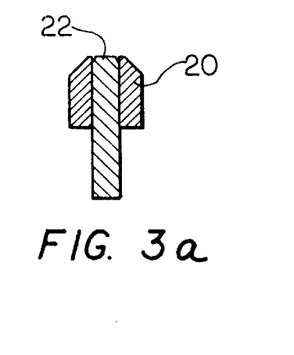
FIG. 3a shows a cross sectional view of the novel pin assembly as disclosed herein.
Figure 3B:
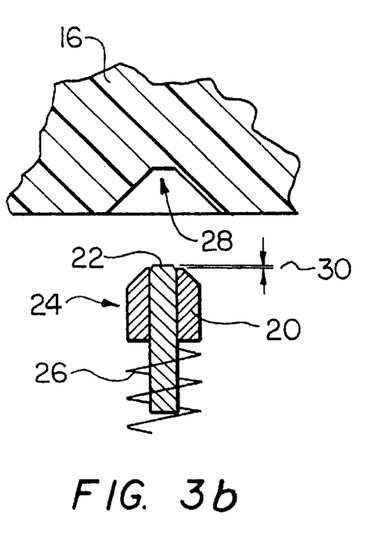
FIG. 3b shows a cross sectional view of a pin assembly before a cassette is placed.
Figure 3C:
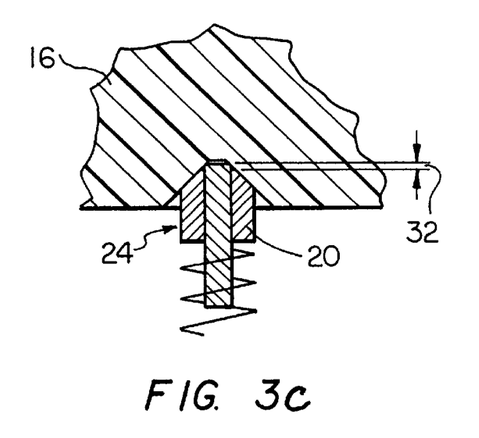
FIG. 3c shows a cross sectional view of a pin assembly with a cassette nested on top.
Figure 6A:
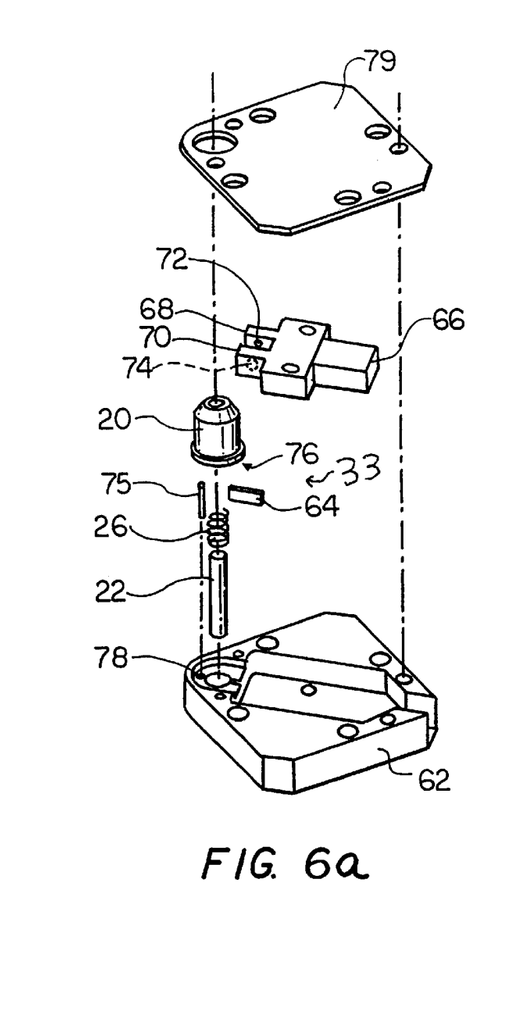
FIG. 6a shows an exploded view of a first embodiment of a pin assembly as defined by the present invention.

In accordance with the present invention, a pin assembly arrangement is used to support a wafer pod, or cassette, at various stages through a wafer fabrication sequence. Referring to FIG. 3a, a pin assembly 24 of the present invention includes a hollow outer cylinder 20 oriented coaxially around a center post 22. Referring to FIG. 3b, a pin assembly 24 is in the unladen position as outer cylinder 20 is shown biased upward by spring 26 just prior to engagement with cassette receptacle 28. Outer cylinder 20 remains slightly below the top of center post 22 by tolerance 30 such that a flat object placed on the pin assembly 24 will not displace the outer cylinder downward. Referring to FIG. 3c, cassette 16 has been placed on pin assembly 24, and outer cylinder 20 has been displaced downwards by travel distance 32. A detectable element, shown by arrow 33 in FIG. 6a, is disposed by movement of the outer cylinder. A sensor 66 is provided to sense the detectable element to thereby detect the downward displacement of the outer cylinder.

Figures 4A, 4B:
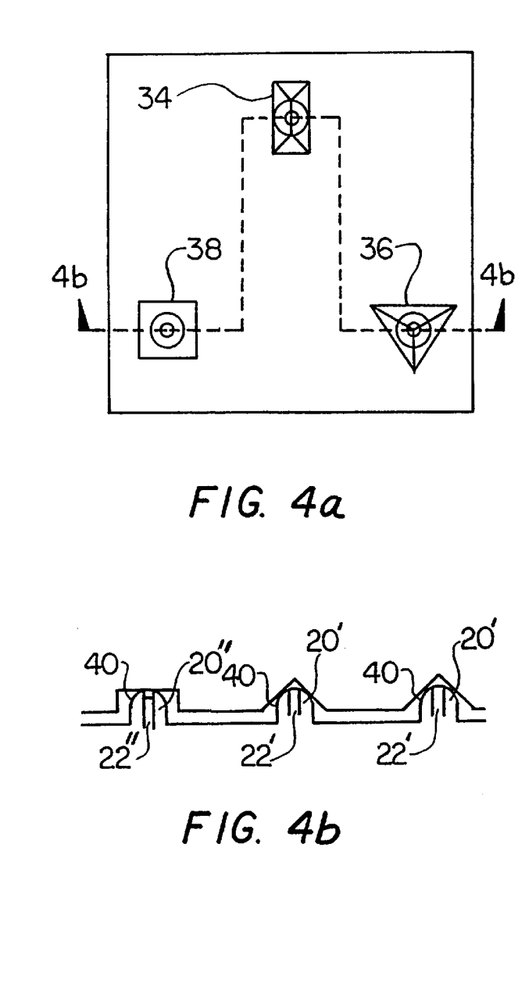
FIG. 4a shows a top view of alternative pin assembly and receptacle mating arrangements.
FIG. 4b shows a cross sectional view of alternative pin assembly and receptacle mating arrangements.

Various receptacle configurations on the bottom of the cassette for mating with the pins are shown in FIGS. 4a–4b. Cassette receptacles can be rectangular 34, triangular 36, or square 38. Typically, the outer cylinder 20 has a straight bevel contour, although cylinder 20 could be curved 40, rather than straight beveled, as long as the outer cylinder 20' moves relative to the center post 22' when a cassette is placed thereupon. Square receptacle 38, however, requires that the top of outer cylinder 20" be slightly above the top of center post 22", rather than slightly below in order to act as a switch. However, as only two pins are needed to assure that a payload is present and nested, such a square receptacle need not cause travel of the outer cylinder 20".

Figure 5:
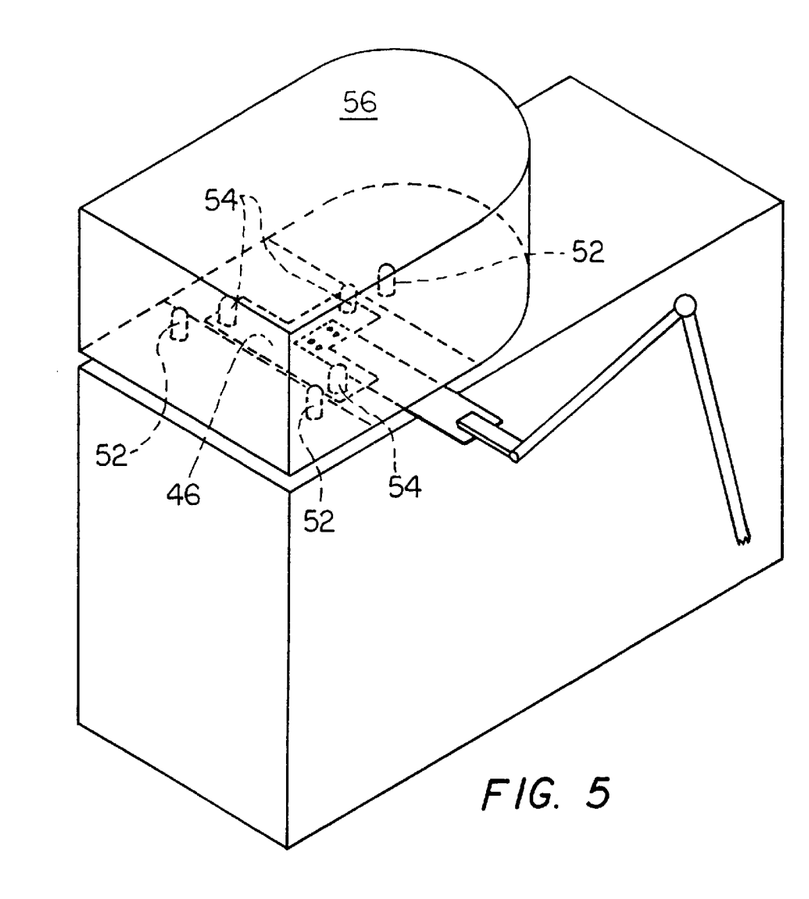
FIG. 5 shows the paddle arm and processing station as a cassette is transferred.

As shown in FIG. 5, the novel pin assembly arrangement can be used with an automated paddle 46 having inner pin assemblies 54 which can be inserted beneath the cassette 56 between outer pin assemblies 52, as no cassette sensing pads, 58 in FIGS. 2a and 2b, are used.

Referring to FIG. 6a, a hollow outer cylinder 20 is mounted coaxially on a center post 22 over a spring 26 on a base 62. A small flag 64 is attached to the bottom surface 76 of outer cylinder 20, extends outward from the center post 22, and is aligned with photosensor 66. Photosensor 66 has a pair of prongs 68, 70 which contain a light, or flux, source 72 and receptor 74, respectively. A dowel pin 75 extends from the bottom surface 76 of the hollow outer cylinder 20 into dowel aperture 78 in the base 62. Dowel pin 75 is of a sufficient length so as to slidably engage hollow outer cylinder 20, in alignment with dowel aperture 78 throughout the range of travel of outer cylinder 20, thereby preventing rotation of the outer cylinder 20. A top plate 79 is affixed to the base 62 to contain the pin assembly.

Figure 6B:
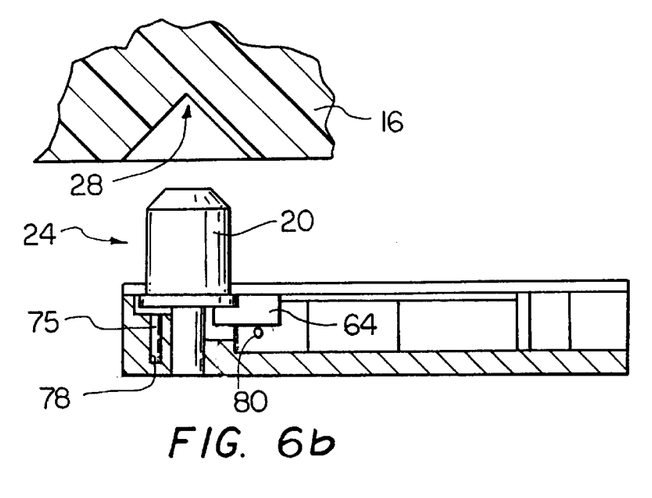
FIG. 6b shows a cross section view of the pin assembly in FIG. 6a at rest.
Figure 6C:
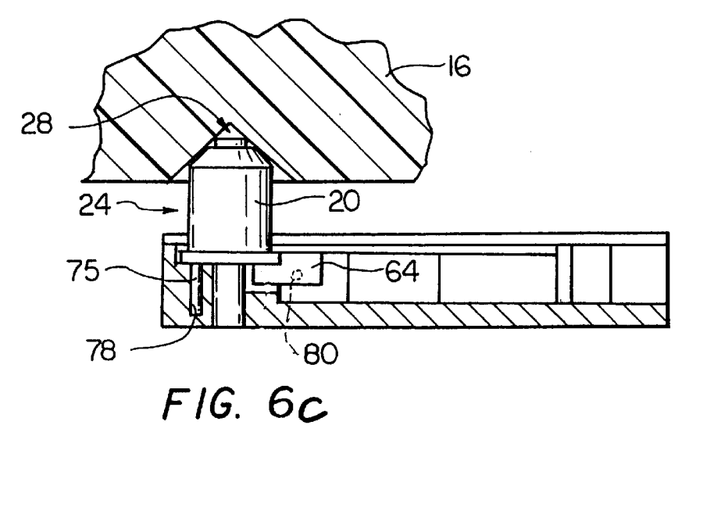
FIG. 6c shows a cross section view of the pin assembly in FIG. 6a when supporting a cassette.

FIG. 6b shows the sensor in FIG. 6a in an untriggered state with the outer cylinder 20 displaced upwards, and photosensor beam 80 of light source 72 uninterrupted by flag 64. As shown in FIG. 6c, as cassette 16 approaches pin assembly 24 and cassette receptacle 28 engages outer cylinder 20, outer cylinder 20 is driven downward, thereby displacing flag 64 into the path of photosensor beam 80. Rotation of outer cylinder 20 is prevented by dowel pin 75 remaining inserted in dowel aperture 78, thereby keeping flag 64 aligned with photosensor prongs 68, 70.

Figure 7A:
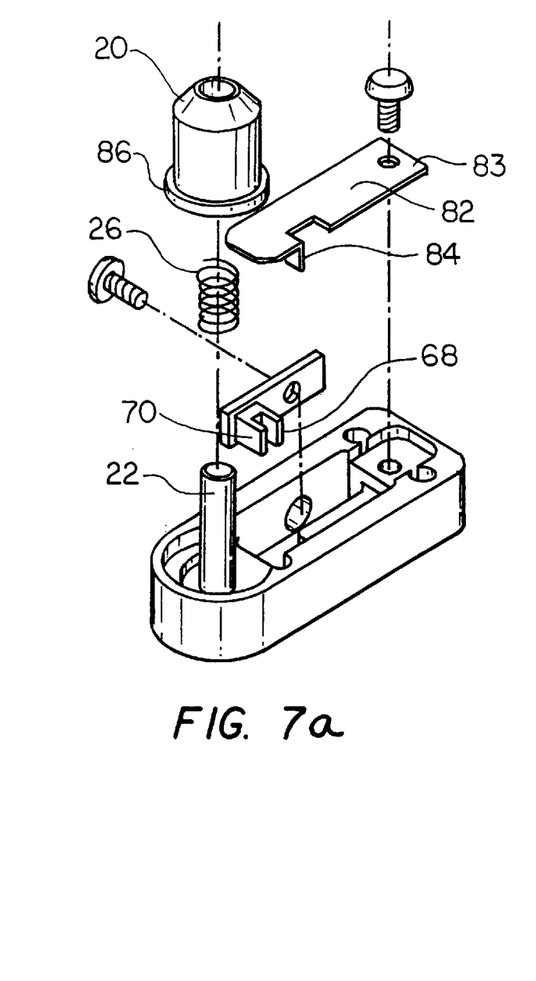
FIG. 7a shows an exploded isometric view of a second embodiment of a pin assembly.
Figure 7B:
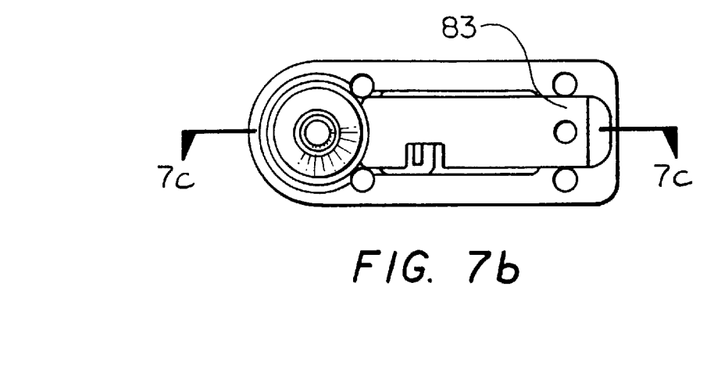
Figure 7C:
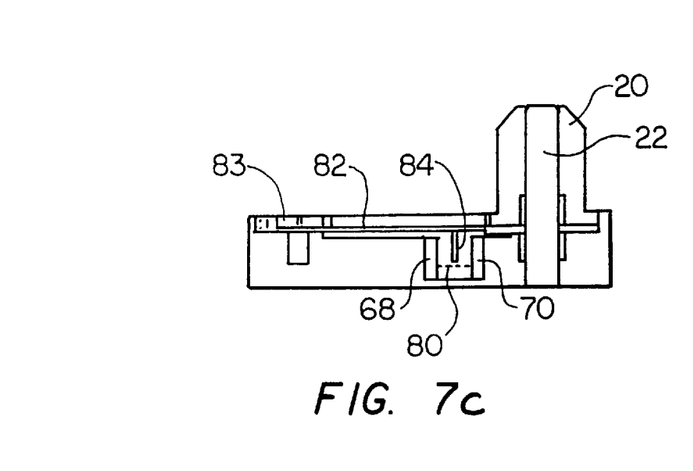
FIG. 7c is a cross section of the pin assembly in 7b along line 7c.

Referring to FIG. 7a, a second embodiment is disclosed which shows a cantilevered member 82 fixed at distal end 83 and having a downward protruding tab 84. The outer cylinder 20 has a protruding annular ring 86 around its base which extends over the end of the cantilevered member 82. The protruding annular ring 86 avoids the need to prevent rotation of outer cylinder 20. As outer cylinder 20 is driven downward, protruding ring 86 displaces cantilevered member downward causing protruding tab 84 to break the beam 80 between photosensor prongs 68, 70 as shown in FIG. 7c. Spring 26 biases outer cylinder 20 and cantilevered member 82 upward such that protruding tab 84 is removed from the path of the beam 80 when the cassette is removed.

Figure 8A:
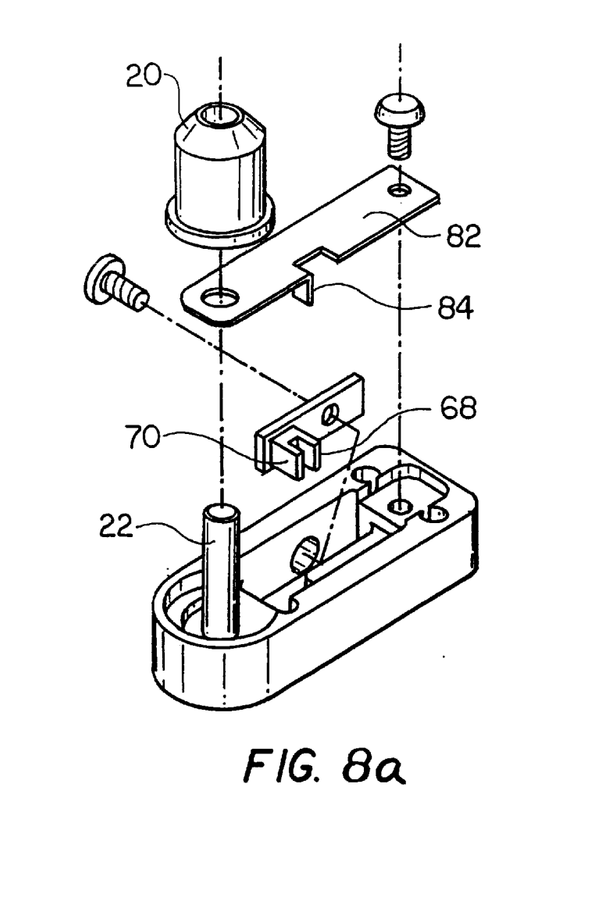
FIG. 8a shows an exploded isometric view of a third embodiment of a pin assembly.
Figure 8B:
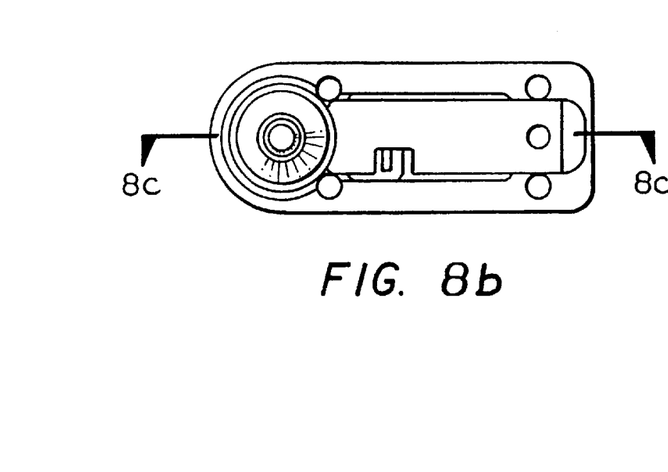
Figure 8C:
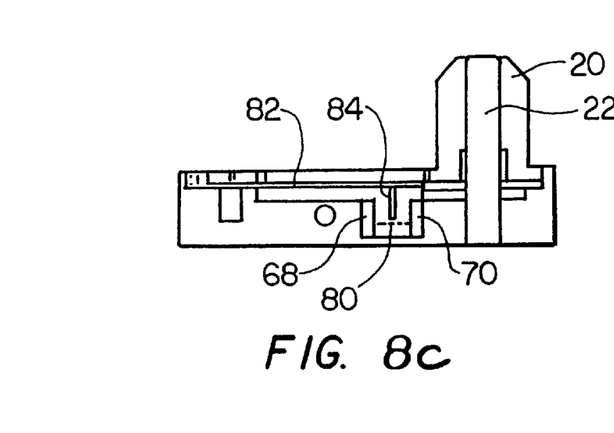
FIG. 8c shows a cross section view of the pin assembly in 8b along line 8c.

A third embodiment is shown in FIG. 8a in which the cantilevered member 82 itself provides the upward force. Outer cylinder 20 moves downward around center post 22 when displaced by a cassette. The protruding ring 86 therefore causes cantilevered member 82 to flex downward such that protruding tab 84 breaks the beam 80 between sensor prongs 68, 70 as shown in FIG. 8c. Cantilevered member 82 is biased sufficiently to drive outer cylinder 20 upward and return to the unflexed position when the cassette is removed, thereby removing protruding tab 84 from the path of the beam 80.

Figure 9A:
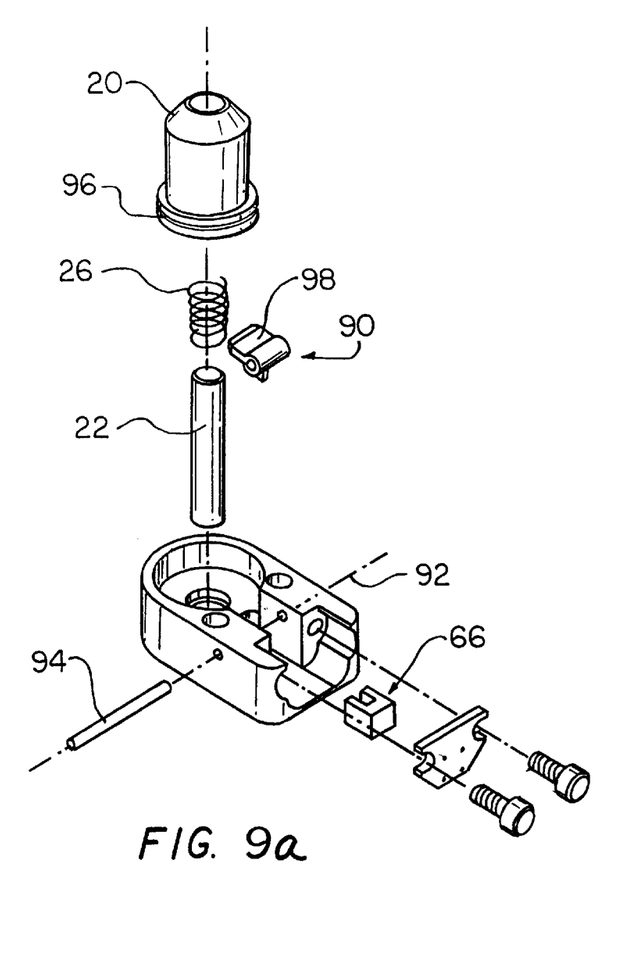
FIG. 9a shows an exploded isometric view of a fourth embodiment of a pin assembly.
Figure 9B:
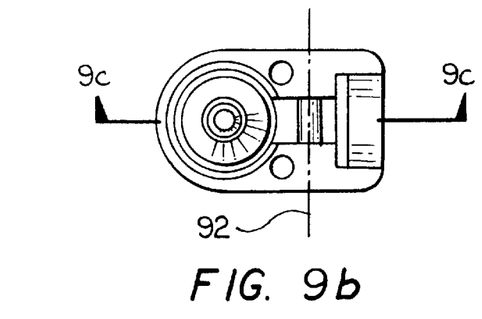
Figure 9C:
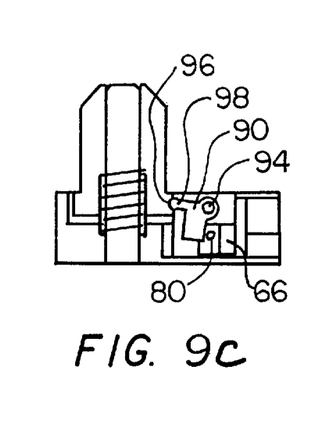
FIG. 9c shows a cross section view of the pin assembly in 9b along line 9c.

A fourth embodiment is shown in FIG. 9a in which the detectable element 90 is rotated, rather than driven linearly, from the downward movement of the outer cylinder 20. Referring to FIGS. 9a–9c, the rotating detectable element 90 is pivotally mounted with pivot pin 94 along an axis 92 orthogonal to the movement of the outer cylinder 20. An annular groove 96 is formed on the lower side of the outer cylinder 20 which accepts a cam extension 98 of detectable element 90. Downward movement of outer cylinder 20 displaces cam extension 98 such that detectable element 90 pivots around axis 92 into beam path 80, thereby triggering sensor 66. Spring 26 biases outer cylinder 20 upward such that outer cylinder 20 is displaced upward and detectable element 90 is removed from beam path 80 when the cassette is removed.

Figure 10A:
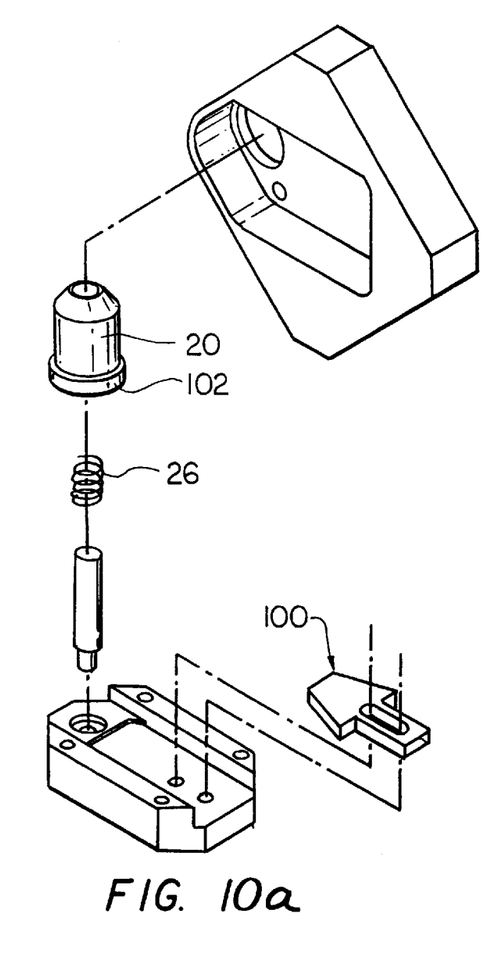
FIG. 10a shows an exploded isometric view of a fifth embodiment of a pin assembly.
Figure 10B:
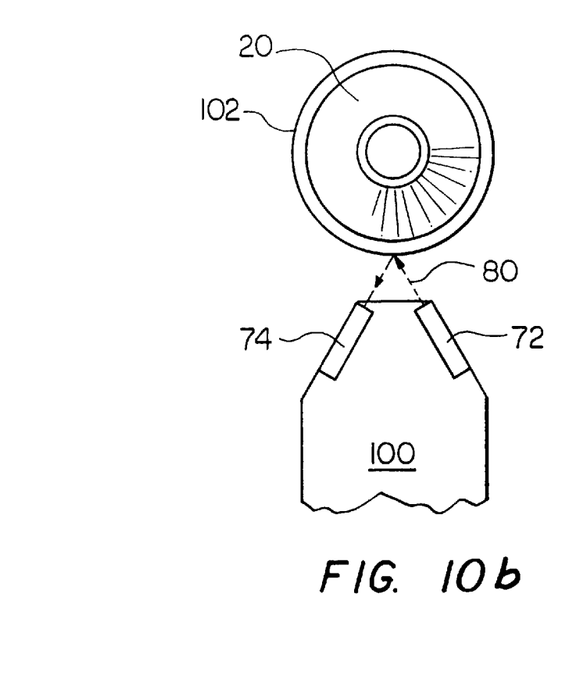

A fifth embodiment is shown in FIGS. 10a–10b in which a photosensor 100 is oriented in such manner so as to reflect light from the cylinder and complete the beam path 80 when the outer cylinder 20 is displaced downward. Outer cylinder 20 has a reflective ring 102 around its bottom perimeter. As outer cylinder 20 is displaced downward, reflective ring 102 intersects beam emitted by sensor light source 72. Sensor light source 72 and sensor receptor 74 are oriented relative to reflective ring 102 such that the beam 80 is reflected to sensor receptor 74 when the reflective ring 102 is displaced into beam 80, as shown in FIG. 10b. Outer cylinder 20 is again biased upwards by spring 26, thereby causing outer cylinder 20 and reflective ring 102 to travel upwards and out of the path of beam 80 when the cassette is removed.

The cassette positioning and detection mechanism incorporates a pin assembly arrangement in which at least one of the pin assemblies comprises the novel pin assembly as described herein. Other pin assemblies may be of the fixed type or novel type, depending on factors such as the expected receptacle configuration on the cassette, sensor redundancy, and manufacturing costs. Also, one of ordinary skill will appreciate that other arrangements for detecting the downward movement of the cylinder can be used. For example, the detectable element could comprise a portion of the cylinder which occludes a light beam upon displacement downwardly. Alternatively, electrical contacts could be positioned to close a circuit, or magnetic portions of the cylinder oriented proximate to sensors so as to sense a magnetic field.

As various extensions and modifications will be apparent to those skilled in the art, the present invention is not intended to be limited to the above embodiments but rather only by the spirit and scope of the following claims.

We claim:

1. A semiconductor wafer cassette positioning and detecting apparatus comprising:
   a cassette support surface having at least three pin assemblies disposed therein to receive a wafer cassette, at least one of said pin assemblies comprising:
      an cylinder having a center bore;
      a center post having an upper end and a lower end, the lower end fixed to the support surface, the post slidably disposed in said center bore;
      a biasing member disposed to bias said cylinder toward the upper end of said center post; and
      a sensor disposed to detect a predetermined point of travel of said outer cylinder toward said lower end of said center post.

2. Apparatus as in claim 1 wherein said biasing member further comprises a spring in communication with said cylinder.

3. Apparatus as in claim 1 wherein said pin assembly further includes a protruding member extending from said cylinder and said sensor further comprises:
   at least one sensor prong disposed such that said protruding member is disposed adjacent to said at least one prong when said cylinder is disposed downward past said predetermined point.

4. The positioning and detecting assembly as in claim 1 wherein the center post and the cylinder have top surfaces and at least one of the top surfaces of the center post and the cylinder protrudes above the other of the top surfaces in an unladen position.

5. Apparatus as in claim 1 wherein said pin assembly further comprises:
   a protruding flag extending from said cylinder and said sensor further comprises:
      a pair of sensor prongs disposed such that said flag is disposed between said prongs when said cylinder is disposed downward past said predetermined point.

6. Apparatus as in claim 1 wherein said biasing member further comprises:
   an elongated resilient member having one end proximate to the cylinder to engage the cylinder and bias the cylinder upwardly, said member fixed at a point distal from the cylinder and moveable at a point proximate to the cylinder; and
   a flag attached to said elongated resilient member, and wherein said sensor is oriented such that said flag is disposed adjacent to said sensor when said cylinder is disposed downward past said predetermined point.

7. Apparatus as in claim 1 wherein said pin assembly further comprises:
   a rotatable flag mounted to the assembly for rotation about an axis orthogonal to the direction of travel of said cylinder, said flag having a cam extension, wherein said cylinder further includes an annular groove therein and said cam extension is received within said groove; and
   said flag is oriented such that said flag is rotated adjacent to said sensor when said cylinder is disposed downward past said predetermined point.

8. Apparatus as in claim 1 wherein said cassette has an arrangement of receptacles located to receive said pin assemblies.

9. Apparatus as in claim 1 wherein said cylinder has a beveled upper edge and said cassette has a beveled receptacle for mating with said beveled tops.

10. An apparatus for detecting an object resting on a pin nest arrangement comprising:
    a support surface;
    a pin assembly comprising:
       a center post having an upper end and a lower end, the lower end fixed to the support surface;
       an outer cylinder having a center bore coaxially mounted for sliding movement on the center post;
       a biasing member disposed to bias said outer cylinder toward the upper end of said center post;
       a sensor located to detect a predetermined point of travel of said outer cylinder toward said lower end of said center post.

* * * * *